United States Patent [19] [11] Patent Number: 5,057,484
Shiota et al. [45] Date of Patent: Oct. 15, 1991

[54] SINGLE CRYSTAL OXIDE SUPERCONDUCTOR AND METHOD OF PRODUCING THE SAME

[75] Inventors: Takao Shiota, Sakura; Hiroshi Hidaka, Tsukuba; Koichi Takahashi, Funabashi; Masahiro Sato, Yotsukaido; Osamu Fukuda, Narashino, all of Japan

[73] Assignee: Fujikura Ltd., Tokyo, Japan

[21] Appl. No.: 188,937

[22] Filed: May 2, 1988

[30] Foreign Application Priority Data

May 1, 1987 [JP] Japan ................... 62-108051
May 1, 1987 [JP] Japan ................... 62-108052
May 8, 1987 [JP] Japan ................... 62-111784
May 25, 1987 [JP] Japan ................... 62-127335

[51] Int. Cl.$^5$ ................................. B32B 9/00
[52] U.S. Cl. ......................... 505/1; 505/701; 505/702; 505/703; 505/704; 428/426; 428/457; 428/688; 428/689; 428/698; 428/699; 428/700; 428/901; 428/930
[58] Field of Search ............ 428/426, 457, 688, 689, 428/698, 699, 700, 901, 930; 505/1, 701-704

[56] References Cited

FOREIGN PATENT DOCUMENTS 59-68702 4/1984 Japan .
59-68701 4/1988 Japan .

OTHER PUBLICATIONS

Adachi et al., *Jpn. J. Appl. Phys.*, 18(8):1637-38 (1979).
Adachi et al., *Jpn. J. Appl. Phys.*, 18(1):193-94 (1979).
Adachi et al., *Jpn. J. Appl. Phys.*, 17(11):2053-54 (1978).
Appl. Phys. Letters, 51(25), Dec. 21, 1987, Chien et al., pp. 2155-2157, Effect of Noble Metal Buffer Layers on SC YBa$_2$Cu$_3$O$_7$ Thin Films.
Journ. Crys. Growth, 85(1987), 615-618, Thin Film Growth of YBa$_2$Cu$_3$O$_x$ from Nitrate Solutions, Heary et al.
Jap. Journ. Appl. Physics, vol. 26, No. 5, May, 1987, pp. L763-L765, Some Probs. in Prep. of SC Oxide Films on Ceramic Substrate, Koinuma et al.

*Primary Examiner*—Patrick J. Ryan
*Attorney, Agent, or Firm*—Cushman, Darby & Cushman

[57] ABSTRACT

A single crystal oxide superconductor and the method of producing the same. One face of a substrate is coated with an oxide superconductor for forming an oxide superconductor layer. Then, the oxide superconductor layer is heated so that the oxide superconductor has a single crystalline structure.

11 Claims, 7 Drawing Sheets

SINGLE CRYSTAL OXIDE SUPERCONDUCTOR AND METHOD OF PRODUCING THE SAME

BACKGROUND OF THE INVENTION

The present invention relates to a single crystalline oxide superconductor and method of producing the same, in which a single crystal layer is formed over a substrate.

Recently, various oxide superconductors which exhibit very high critical temperatures (Tc) have been increasingly discovered. Various attempts have been made to coat a metallic substrate with superconductors by sputtering. However, such superconductors varied rather widely in critical temperature, and critical current density thereof was not sufficient.

The inventors have found that such drawbacks in physical properties were due to the crystal structure of superconductors. More specifically, oxide superconductors which are produced by sputtering are of multi-crystals and are rather high in density of lattice defects, such as hole and dislocation, in each crystal grain.

It is an object of the present invention to provide a single crystal oxide superconductor and a method of producing the same which fairly reduces the drawbacks above mentioned.

SUMMARY OF THE INVENTION

With this and other objects in view, the present invention will provide a single crystal oxide superconductor containing: a single crystal layer formed over the substrate. The present invention may be applied to various devices utilizing superconductivity, such as Josephson junction device, superconducting integrated circuit and sensors such as SQUID sensor.

The substrate may be, according to the present invention, made of a substance selected from the group consisting of: a polycrystalline metal or alloy of Pt, Cu, Ag, Ru, Rh, Pd, Os and Ir. Ceramics fibers as the substrate are disclosed in a copending U.S. patent application entitled "OXIDE SUPERCONDUCTOR CABLE AND METHOD OF PRODUCING THE SAME", filed on Apr. 6, 1988 and claiming priorities from Japanese Patent Application Nos. 62-85152, 62-85153, 62-85154 and 62-105570. The disclosure of the U.S. application is incorporated herewith by reference.

The single crystal oxide superconductor is typically represented by the formula $A_xB_yCu_zO_9\text{-}\delta$ where: A includes at least one element selected from the group consisting of Sc, Y, La, Ce, Pr, Nd, Pm, Sm, Eu, Gd, Tb, Dy, Ho, Er, Tm, Yb and Lu; B includes at least one element selected from the group consisting of Be, Sr, Mg, Ca, Ba and Ra; about $0.1 < x <$ about 2.0, preferably about $0.3 < x <$ about 0.4; about $1 < y <$ about 3, preferably about $0.6 < y < 0.7$; about $1 < z <$ about 3, preferably about $0.9 < z <$ about 1.1; and about $0 < \delta <$ about 7, preferably about $3.5 < \delta < 4.5$. Possibility of use of other superconductors is discussed in our copending U.S. patent application entitled "AN OXIDE SUPERCONDUCTOR", filed on Apr. 23, 1988 and claiming priorities from Japanese Patent Application Nos. 62-99351, 62-146484 and 62-169122. The disclosure of this U.S. patent application is incorporated herewith by reference.

The superconductor according to the present invention preferably includes a single crystalline intermediate layer, interposed between and adhered to the substrate and the single crystalline oxide superconductor, the intermediate layer being made of a substance having an intermediate value, in each of thermal expansion coefficient and lattice constant, between the substrate and the superconductor layer. With such an intermediate layer, the superconductor withstands an extreme temperature difference and the superconductor layer has a substantially complete single crystalline structure.

Preferably, the intermediate layer is, according to the present invention, made of a substance selected from the group consisting of $Cu_2O$, $ZnO$, $Al_2O_3$, $BaO$, $MgF_2$, $CaF_2$ and $BaF_2$.

The superconductor of the present invention may include a single crystalline super lattice layer, interposed between the substrate and the superconductor layer and including compositions of both the substrate and the oxide superconductor for matching both the superconductor layer and the substrate in lattice constant and thermal expansion coefficient. The intermediate layer enhances adhesion strength of both the superconductor layer and the substrate and reduces thermal stresses generated between the superconductor layer and the substrate.

BRIEF DESCRIPTION OF THE DRAWINGS

In the drawings, in which like reference characters designates similar members or similar substance and descriptions thereof will be omitted after once given.

DETAILED DESCRIPTION OF THE INVENTION

Figure 1:
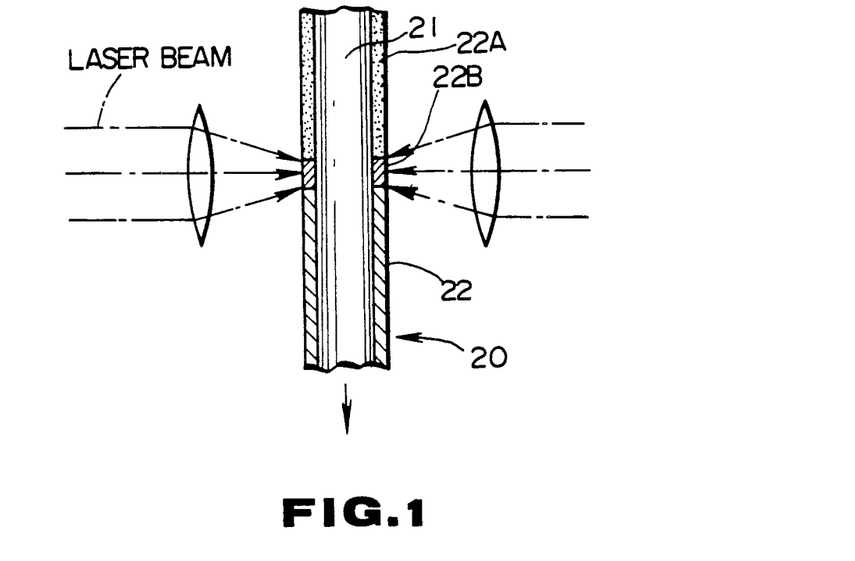
FIG. 1 is a view, partly in axial cross-section, of an oxide superconductor having a single crystalline oxide superconductor layer coated over a filament according to the present invention.

Referring to FIG. 1, a single crystal oxide superconductor 20, according to the present invention, includes a filament 21 as a substrate coated with a single crystal superconductor layer 22. The filament 21 and the superconductor layer 22 may be made of materials previously named.

For fabricating the single crystal oxide superconductor 20, firstly an oxide superconductor material is adhered to the fiber 21 by conventional sputtering, chemical vapor deposition (CVD), physical vapor deposition (PVD) and powder flashing techniques. The thickness of the superconductor layer according to these techniques is typically about 0.1 $\mu$m to about 1 $\mu$m. Furthermore, such adhesion of the oxide superconductor may be carried out by the co-called sol-gel technique, in which a dispersion of a powder material of the superconductor layer and an organic solvent is applied over the filament 21 and is then heated to solidify it as illustrated at 22A. According to this sol-gel technique, the superconductor layer may have a thickness about 0.5 to about 10 $\mu$m. Next, a laser beam is applied to the superconducting layer 22A to melt the latter in an atmosphere including a small amount of oxygen, at which oxygen defect is prevented, to form a molten zone 22B, which is gradually moved by pulling the filament in the direction arrowed in FIG. 1 while the filament is rotated about its axis. Typically, the molten zone 22B has a width of about 2 $\mu$m to about 30 $\mu$m and moves at a speed of about 1 mm/min to about 50 mm/min. With this operation, the molten zone 22B is continuously solidified with the same orientation as the crystal initially solidified and produced, and thus the single crystal oxide superconductor layer 22 is formed.

Figure 2:
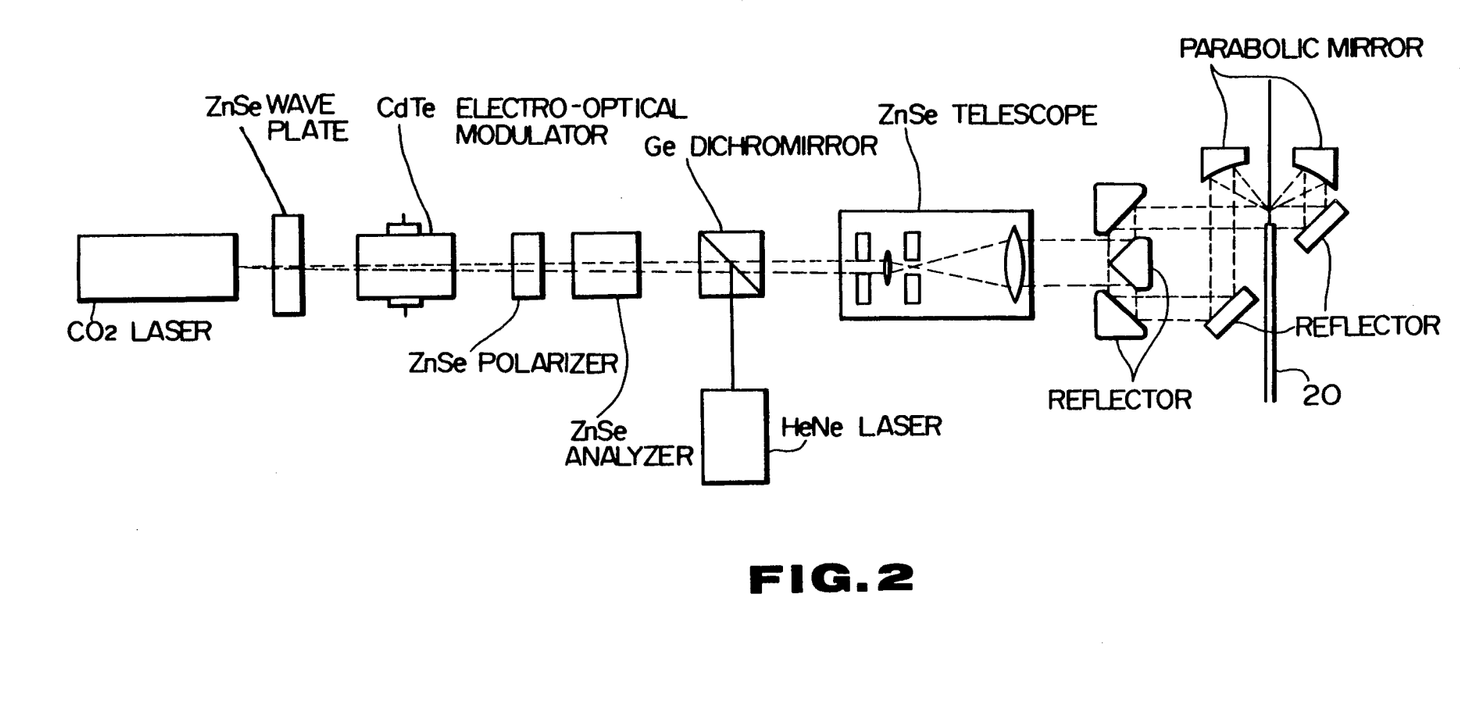
FIG. 2 is an illustration of heating apparatus for single crystallizing the superconductor in FIG. 1.

Used for such a heating treatment by the laser beam is an apparatus shown in FIG. 2, in which a laser beam generated from a $CO_2$ laser generator passes through a ZnSe wave plate, CdTe electro-optical modulator, ZnSe polarizer, ZnSe analyzer and ZnSe telescope and is then reflected by reflectors and is finally applied by pair of parabolic mirrors to the oxide superconductor thin film 22A. Furthermore, another laser beam is generated from a HeNe laser and passes through partially the same passage as the $CO_2$ laser beam to the thin film 22A. Other conventional apparatuses, such as high frequency induction heater, resistance heater and arc heater, may be used for melting a micro-spot of the superconducting layer.

The single crystal oxide superconducting layer 22 thus formed has little intergranular and very low density of lattice defects such as hole and dislocation, and hence exhibits both high critical temperature with small scattering and extremely high critical current density.

Instead of the filament 21, a plate substrate may be, according to the present invention, coated with a single crystal superconductor layer to produce a superconductor.

Figure 3:
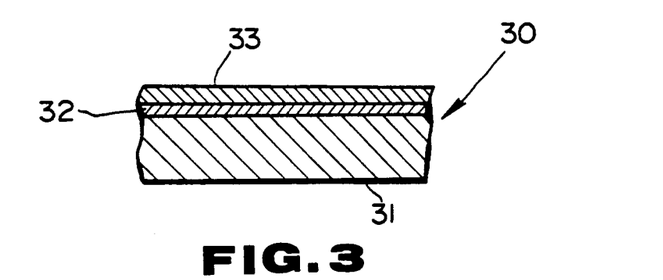
FIG. 3 is a vertical cross-section of a modified form of the superconductor in FIG. 1, with an intermediate buffering layer.

FIG. 3 illustrates a modified form 30 of the superconductor in FIG. 1, in which modified form an intermediate layer 32 is formed between a plate substrate 31 and a superconductor layer 33.

The substrate 31 and the superconductor layer 33 may be made of the same material as those in the superconductor in FIG. 1, respectively. The superconductor layer 33 may be produced in the same manner as the superconductor layer 22 in the preceding embodiment although the substrate 33 is not rotated during processing. The intermediate layer 32 may be made of an oxide, such as $Cu_2O$, $ZnO$, $Al_2O_3$ and $BaO$, or a fluoride, such as $MgF_2$, $CaF_2$ and $BaF_2$, but it should be intermediate in physical property, such as lattice constant and coefficient of thermal expansion between the substrate 31 and the superconducting layer 33.

Figure 4:
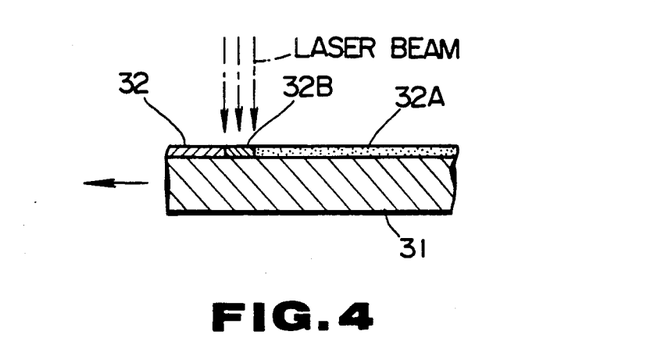
FIG. 4 is an illustration of how to form the intermediate layer of the superconductor in FIG. 3.
Figure 5:
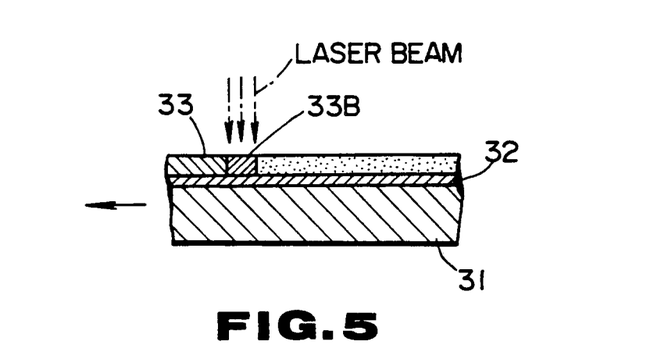
FIG. 5 is an illustration of how to single crystallize a superconductor layer to form the single crystalline superconductor layer of the superconductor in FIG. 3.

For fabricating the superconductor 30, the material of the intermediate layer 32 may be adhered to one surface of the plate substrate 31 in the same manner as in the superconductor material layer 22A in FIG. 1. The intermediate layer 32 is also monocrystallized by the same manner as in the superconductor layer 22B in FIG. 1. (see FIG. 4) The superconductor layer 33 is coated over the intermediate layer 32. (FIG. 5) Since the intermediate layer 32 has a single crystal structure, the superconductor layer 33 has an almost complete single crystal structure.

Figure 6:
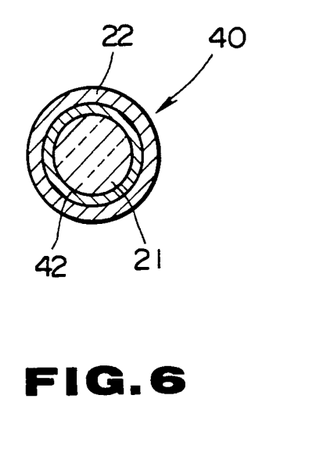
FIG. 6 is a cross-section of another modified form of the superconductor in FIG. 1.
Figure 7:
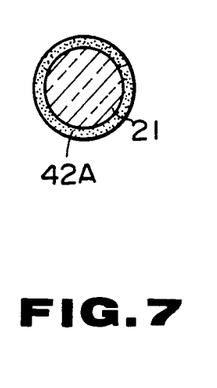
FIGS. 7 and 8 are illustrations about how to form the intermediate layer of the superconductor in FIG. 6.
Figure 8:
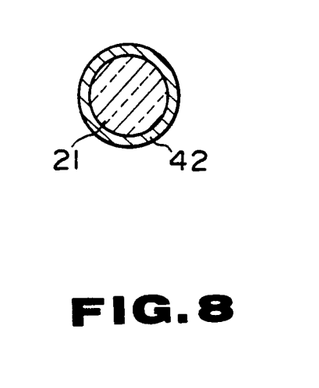

Another modified superconductor 40 is illustrated in FIG. 6, in which an intermediate layer 42 is formed between filament 21, as the substrate, and the superconductor layer 22. The material 42A of the intermediate layer 42 may be of the same material as in the intermediate layer 32A and is monocrystallized in the same manner as in the superconductor layer 22 in FIG. 1.

Figure 9:
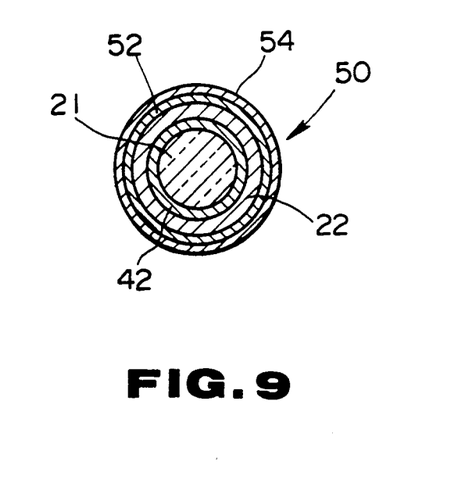
FIG. 9 is a cross-section of a modified form of the superconductor in FIG. 6.

FIG. 9 is a modified form 50 of the superconductor 40 in FIG. 6. The modified superconductor 50 is distinct from the superconductor 40 in that another intermediate single crystalline layer 52 and another single crystalline superconductor layer 54 is formed. The intermediate layer 52 and the superconductor layer 54 may be made of the same material in the same manner as in the intermediate layer 42 and the superconductor layer 22, respectively. More intermediate and superconductor layers may be formed over the superconductor 50. Each intermediate layers 42, 52 may have sublayers, that is, it may be formed by a plurality of sublayers.

Figure 10:
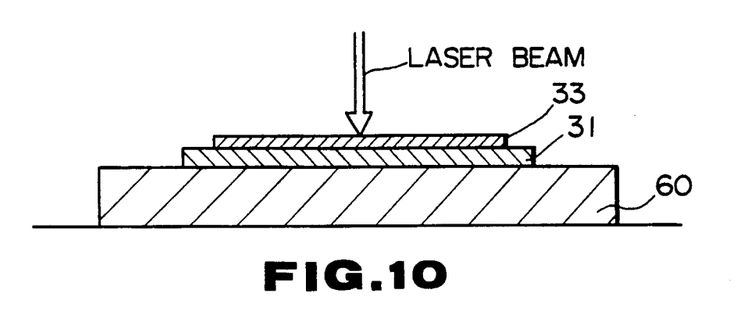
FIG. 10 is an illustration about how to produce a superconductor having a single crystalline oxide superconductor layer over a substrate plate using a double laser beam according to the present invention.

FIG. 10 illustrates a modified form 60 of the superconductor 20 in FIG. 1. The modified form 60 includes a substrate plate 31 coated with a superconducting layer 33.

Figure 11:
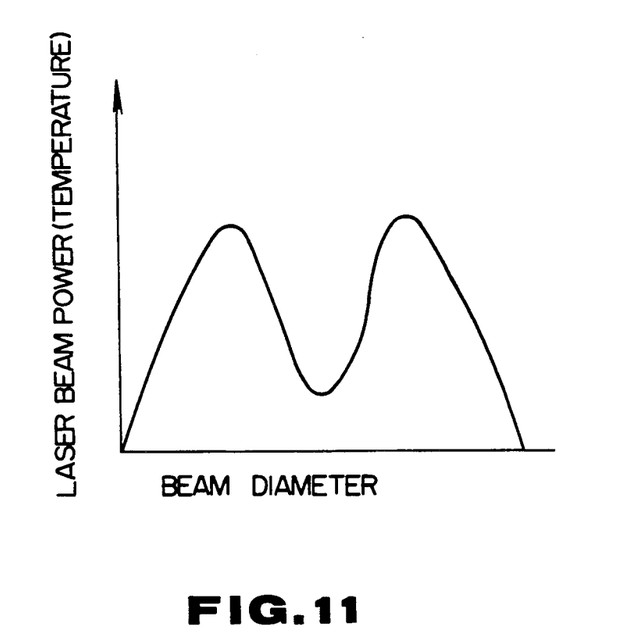
FIG. 11 is a graph showing the relationship between the laser beam power output and the distance from the center of the laser beam in FIG. 10.

For producing the superconductor layer 33, an oxide superconductor thin film, having a predetermined thickness, is formed by sputtering on the substrate 31 heated in an argon atmosphere including oxygen. The superconductor thin film 33 may be made of $BaPbBiO_3$, $SrTiO_3$, $(Sr,Ba)TiO_3$ and $(Ca, Sr)TiO_3$ other than the material of the superconductor previously mentioned. Then, the substrate 31 with the superconductor layer 33 is placed on a conventional X-Y stage which is horizontally moved in x and y directions perpendicular to each other while a laser beam, which keeps its central portion lower in temperature than the periphery thereof (FIG. 11), is applied to the superconductor layer 33. Thus, the laser beam scans the superconductor layer 33 by the movement of the X-Y stage for single crystallizing the latter.

Figure 12:
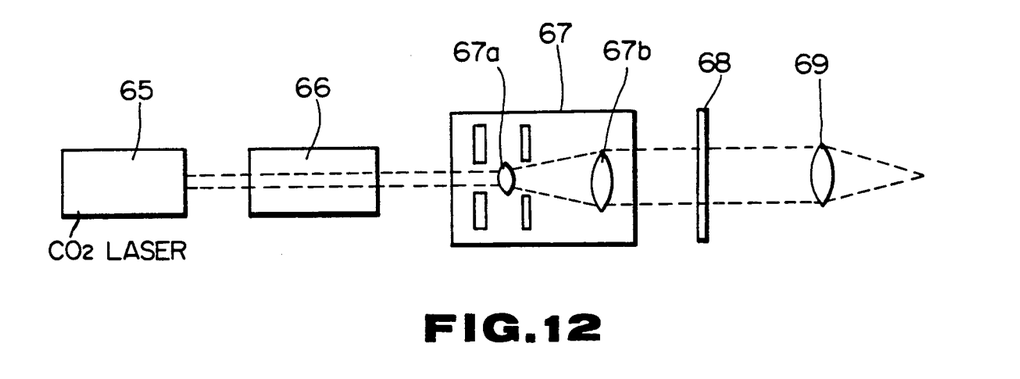
FIG. 12 is an illustration of a laser beam generator, similar to the apparatus in FIG. 2, used for single crystallizing the superconductor in FIG. 10.

For producing the laser beam, use is made of a laser beam generator which is of the same type as the generator in FIG. 2 except an absorption plate 68 and a convex lens 69. The laser beam which has passed through an output control unit 66 is enlarged in its diameter by a telescope 67 and then passes through the absorption plate 68 which has a mesh of which central portion is finer that the peripheral portion. The laser beam which has passed the absorption plate 68 has a laser beam density smaller in its central portion than in its peripheral portion. Then, the laser beam thus prepared is focused by the convex lens 69. With such an equipment, the laser beam having a temperature higher at the periphery than at the center is produced. Thus, the portion, molten by the laser beam application, is solidified from the center towards the periphery thereof, so that an excellent single crystalline superconductor layer is formed.

Figure 13:
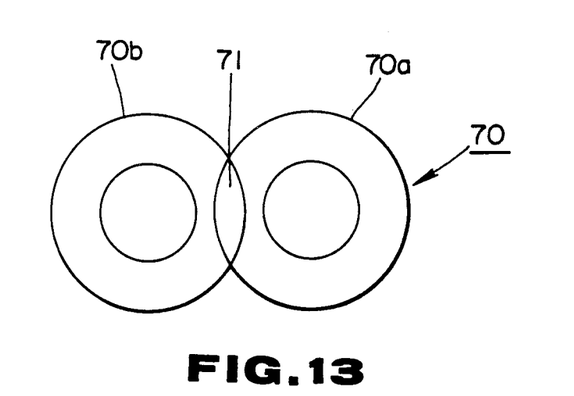
FIG. 13 is an illustration of the beam used in FIG. 10.
Figure 14:
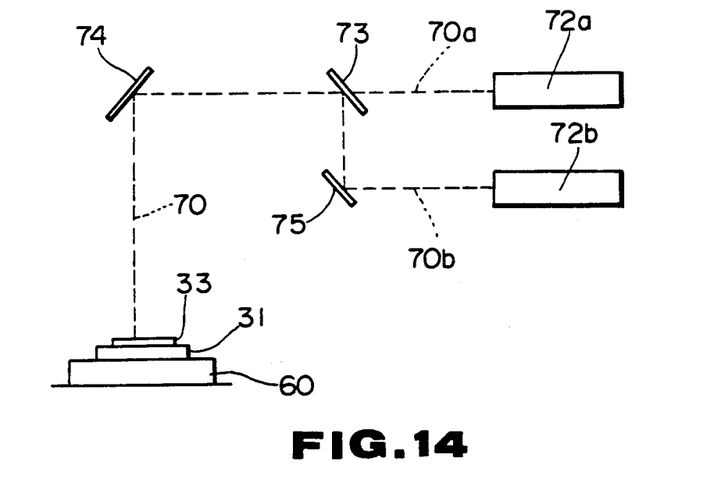
FIG. 14 is an illustration of the system, using the laser beam generators in FIG. 12, for single crystallizing the superconductor in FIG. 10.

FIGS. 13 and 14 show how to generate a laser beam 70 modified from the laser beam in FIG. 12, in which the laser beam 70 has a double beam central portion 71 which is formed by making one YAG (yttrium-aluminum-garnet) laser 70a overlap the other one 70b. With such an arrangement, the temperature of the central portion of the beam becomes lower than the temperature of the peripheral portion.

How to produce such a double beam 70 is illustrated in FIG. 14, in which an YAG laser beam 70a, generated from a laser generator 72a, passes through a mirror 73 while an YAG laser beam 70b from a laser generator 72b is reflected from mirrors 75 and 73 so that the YAG laser beam 70b overlaps the YAG laser beam 70a as in FIG. 13. The double beam 70 thus formed is reflected by a mirror 74 and then applied to the superconductor layer 33.

The double beam 70 may be produced by a single YAG laser beam, in which the single YAG laser beam was separated into two beams, which are then superposed so that peripheral portions thereof overlap as in FIG. 12. For generating the laser beam, Ar laser, excimer laser and similar laser may be used in place of $CO_2$ laser and YAG laser.

Figure 15:
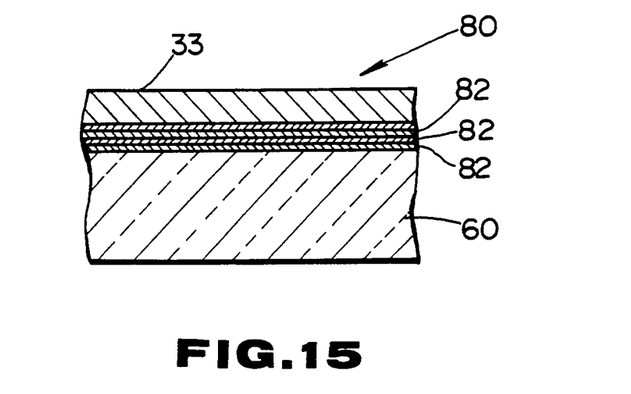
FIG. 15 is a fragmentary cross-section of a modified form of the superconductor in FIG. 1.

A still modified form 80 of the superconductor in FIG. 3 is illustrated in FIG. 15, in which the modified superconductor 80 has a substrate plate 60 coated with a plurality of super lattice layers 82, 82, 82 and 82, over which is coated a single crystalline oxide super conductor layer 33.

The substrate 60 may be of a single crystalline semiconductor, such a Si, GaAs and InP, and an oxide such as a $SiO_2$, $Al_2O_3$ and $LiNbO_3$. The super conductor layer 33 may be made of a superconducting substance as already mentioned.

A mixture of an oxide of a IIIa group or IIa group element, which is contained in the oxide superconductor, and the material of the substrate 60 may be, according to the present invention, used for each super lattice layer 82. For instance, the oxide may include CuO, LaO, BaO and $Y_2O_3$. Other instances are given in co-pending U.S. patent application Ser. No. 7/170,018 entitled "METHOD OF PRODUCING OXIDE SUPERCONDUCTING WIRE AND OXIDE SUPERCONDUCTING WIRE PRODUCED BY THIS METHOD", filed on Mar. 18, 1988 and claiming priorities from Japanese Patent Application Nos. 62-124553, 62-126691 and four other Japanese patent applications. The disclosure of this U.S. patent application is incorporated herein by reference. The proportion of the material of the substrate in the super lattice layer 82 adjacent to the substrate 60 is larger than in the super lattice layer 82 adjacent to the superconductor layer 33.

Figure 16:
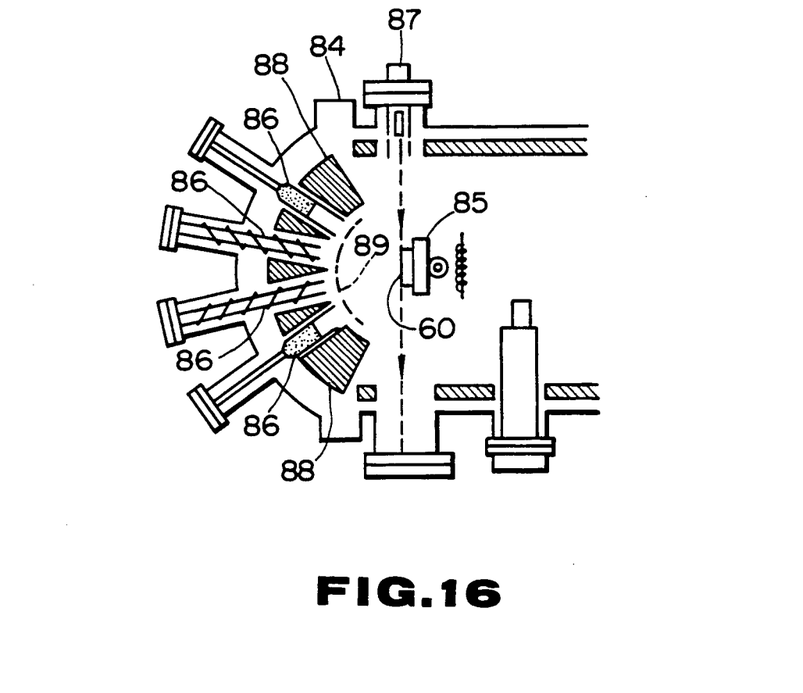
FIG. 16 is a diagrammatic cross-sectional view of a molecular beam epitaxy equipment used for fabricating the superconductor in FIG. 15.

For producing such a superconductor 80, a material of the super lattice layer 82, adjacent to the substrate 60, is coated over one surface of the substrate 60 by molecular beam epitaxy (MBE) using MBE equipment in FIG. 16, in which a plurality of (four) dopants 86, which are directed to a holder 85, are spacedly arranged within a vacuum chamber 84 which are kept at an ultra high vacuum level of $10^{-11}$ Torr. Under such a condition, a material of each super lattice layer is sequentially heated to eject a molecular beam, which adheres to a substrate 60 held on the holder 85 to thereby produce the single crystalline super lattice layer 82. The reference numbers 87, 86 and 89 designate a measuring equipment (Rheed gun) for observing the growth of the crystal, liquid nitrogen shroud and shutter, respectively.

Each super lattice layer 82 obtained with such an equipment has a thickness generally from about 10 Å to about 200 Å, preferably about 20 to about 50 Å and has a complete single crystalline structure. The first layer or layer 82 adjacent to the substrate 60 has a composition the most nearest to the composition of the substrate 60 among the super lattice layers 82 so that it may closely resemble to the substrate 60 in lattice constance and coefficient of thermal expansion. The difference in lattice constant between adjacent two layers and between the lowermost layer and the substrate is generally less than about 1%. The difference between adjacent two layers as well as between the lowermost layer and the substrate is generally about 1% or less in lattice constant and generally about 10 times or less, preferably about 3 times or less in thermal expansion coefficient. With such a structure, the lattice of the first super lattice layer 82 substantially matches that of the substrate 60. Then, a second super lattice 82 is formed over the first super lattice 82. The second super lattice 82 contains the material of the super conducting layer 33 somewhat more than the first super lattice layer, so that it matches the first super lattice layer. By repeating these procedures, a plurality of (four in this modification) super lattice layers ar formed with the proportion of the superconductor material gradually increased from the lowermost super lattice layer to the uppermost layer and lattices of adjacent two super lattice layers substantially matched to each other. The super lattice layers 82 have each a complete single crystalline structure. The modified superconductor 80 thus provides an extremely high adhering strength of the superconductor layer 33 to the substrate 60 and prevents the superconductor layer 33 from being separated from the uppermost super lattice layer 82 due to extremely large temperature difference since the thermal stress is prevented from applied to the superconductor layer 33, super lattice layers 82 and the substrate 60. The single crystalline structure of the superconductor layer 33 enhances superconductivity thereof. In the presence of the intermediate super lattice layers, the present invention may be used for an electronic device, such as Josephson junction device, and SQUID.

Figure 17:
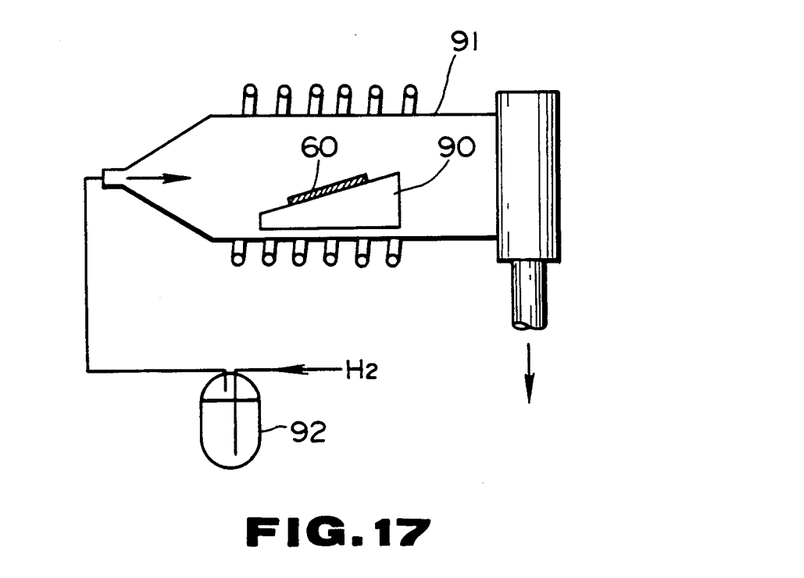
FIG. 17 is a diagrammatic illustration of a metalorganic chemical vapor-phase deposition equipment used for producing the superconductor in FIG. 15.

In place of the MBE technique, the superconductor layer 33 may be produced by metalorganic chemical vapor-phase deposition (MOCVD). In which case, use is made of a MOCVD equipment illustrated in FIG. 17, in which a dopant 12 of the material of a super lattice layer 82 is evaporated and the evaporated gas is introduced into a vacuum chamber 91, where it adheres to a substrate 60 held in a holder 90. Then, the dopant is replaced by another dopant for superconductor layer 33 for forming the latter.

EXAMPLE 1

A Pt wire having 0.3 mm diameter was coated with a 2 μm thick Y-Ba-Cu-O system superconductor thin film by sputtering. AT this stage, the superconducting layer had a critical temperature of 60 K. and a critical current of 250 A/cm$^2$ at 10 T. Subsequently, the superconducting layer was subjected to heat treatment in an oxidizing atmosphere by an apparatus as in FIG. 2 for single crystallization. During this operation,1 the melting zone of the superconducting layer had a width of 120 μm in the moving direction thereof and moved at a speed of 2 mm/min. The superconductor thus prepared was Ba$_{0.45}$Y$_{0.5}$CuO$_4$ and was almost a complete single crystal. It had a critical temperature of 85 K. and a critical current of 2000 A/cm$^2$ at 10 T with little scattering.

EXAMPLE 1A

The same superconductor was prepared on the same conditions as in Example 1. In this example the superconductor layer was monocrystallized at 1060°–1065° C. and in an oxidizing atmosphere including 70% of Ar and 30% of O$_2$. The results were the same as in Example 1.

EXAMPLE 2

One surface of an Al$_2$O$_3$ substrate plate had both Al$_2$O$_3$ super lattice layers and CuO.LaO super lattice layers alternatively coated over it to form twenty layers in total, each layer having a thickness 50 Å. Then, coated over the alternative layers was a 1 μm thick LaO.CuO super lattice layer, over which was then coated a 1 μm thick super lattice layer of a LaO.CuO and LaO.CuO.BaO, over which was in turn coated a 2000 Å thick Ba$_{0.6}$La$_{0.4}$CuO$_4$ superconductor layer. The superconductor thus obtained had a substantially almost complete single crystal structure and exhibited excellent superconductivity with a critical temperature 32 K. The superconductor underwent both a heat cycle test and bending test for radii of curvature. The number of times of trial at which the superconductor layer was separated from the super lattice layer was determined for each specimen. The results are given in Table 1.

COMPARATIVE TEST 1

A superconductor similar to the superconductor of Example 1, except for the super lattice layers were not formed, was prepared and subjected to the same tests as in Example 1. The results are also given in Table 1.

TABLE 1

| | Ex. 1 | Ex. 2 | Com. Ex. 1 | Com. Ex. 2 |
|---|---|---|---|---|
| Heat cycle test (cooling from room temperature to temperature of liquid nitrogen) | >200 | >200 | 105 | 105 |
| Bending Test curvature of radius (mm) | | | | |
| 100 | | 825 | | 200 |
| 80 | >1000 | — | 200 | — |
| 60 | | 489 | 190 | 60 | 60 |
| 40 | | 26 | 10 | 4 | 4 |
| 20 | | 5 | 1 | 1 | 1 |

EXAMPLE 3

A silica glass fiber of 125 μm diameter was coated with a first 1 μm thick intermediate layer by adhering a metallic silicon with CVD technique and was, then, subjected to heat treatment by an apparatus a in FIG. 2 for single crystallizing the silicon. Subsequently, coated over the first intermediate layer was a second 0.5 μm thick intermediate layer of MgF$_2$, over which was formed 2 μm thick La-Sr-Cu-O system superconductor layer by sputtering. During the sputtering, the glass fiber was heated to 400° C. in an oxidizing atmosphere. The superconductor was heated by the apparatus with 9.2 W output for single crystallization.

The 20 cm long superconductor thus obtained had a critical temperature of 60 K. and critical current density of 800 A/cm$^2$ at 10 T. The superconductor underwent the same heat cycle and bending tests as in Example 1. The results were also indicated in Table 1.

COMPARATIVE TEST 2

Another superconductor which was the same as that of Example 2 except that no intermediate layers were formed was prepared and subjected to the same test as in Example 1. The results are given in Table 1.

EXAMPLE 4

A 3 μm thick Ba-Y-Cu-O system superconductor thin film was formed by sputtering on a TiSrO$_3$ substrate plate heated at 400° C. in an argon atmosphere including oxygen. A laser beam, which had 30 μm diameter and a temperature higher in the periphery than the center, was generated by an apparatus, similar to the apparatus in FIG. 12, with 20 W CO$_2$ laser, and it was applied to the superconductor thin film which was horizontally moved by the X-Y stage for the laser to scan it. The single crystallized superconductor thin film had a critical temperature of 93 K. and a critical current density of 2000 A/cm$^2$.

What is claimed is:

1. A single crystal oxide superconductor comprising:
   a substrate made of a substance selected from the group consisting of: a polycrystalline metal of Pt, Cu, Ag, and Au; an alloy of Pt, Cu, Ag, and Au; a silica glass; an optical glass fiber; Al$_2$O$_3$; SiC; Si$_3$N$_4$; ZrO$_2$; and Y$_2$O$_3$; and
   a single crystal oxide superconductor layer coated over the substrate, the single crystal oxide superconductor layer being represented by the formula:

$$A_xB_yCu_zO_{9-\delta}$$

where: A includes at least one element selected from the group consisting of Sc, Y, La, Ce, Pr, Nd, Pm, Sm, Eu, Gd, Tb, Dy, Ho, Er, Tm, Yb and Lu; B includes at least one element selected from the group consisting of Be, Sr, Mg, Ca, Ba and Ra; about $0.1 < x <$ about 2.0; about $1 < y <$ about 3; about $1 < z <$ about 3; and about $0 < \delta <$ about 7.

2. A single crystal oxide superconductor as recited in claim 6, wherein the substrate is in the form of a plate and the oxide superconductor layer is coated over one face of the substrate plate.

3. A single crystal oxide superconductor as recited in claim 2, wherein the substrate is a fiber.

4. A single crystal oxide superconductor comprising a substrate made of a substance selected from a group consisting of: a single crystalline semiconductor of Si, GaAs and SnP; SiO$_2$; Al$_2$O$_3$ and LiNbO$_3$;
   a single crystal oxide superconductor layer coated over the substrate, the single crystal oxide superconductor layer having a high critical temperature; and a single crystalline super lattice layer including compositions of both the substrate and the oxide superconductor, the single crystalline super lattice layer being positioned between the substrate and the oxide superconductor.

5. A single crystal oxide superconductor comprising a substrate made of a substance selected from a group consisting of: a single crystalline semiconductor of Si, GaAs and InP; $SiO_2$; $Al_2O_3$ and $LiNbO_3$;
a single crystal oxide superconductor layer coated over the substrate, the single crystal oxide superconductor having a high critical temperature; and a single crystalline super lattice layer including compositions of both the substance and the oxide superconductor, the single crystalline super lattice layer being positioned between the substrate and the oxide superconductor,
wherein the super lattice layer is provided in plural in a stacked manner, including an uppermost super lattice layer adhered to the superconductor layer and a lowermost super lattice layer adhered to the substrate, and wherein the uppermost lattice layer includes the composition of the superconductor more than the lowermost super lattice layer while including the composition of the substrate less than the lowermost super lattice layer.

6. A single crystal oxide superconductor comprising:
a substrate made of a substance selected from the group consisting of: a polycrystalline metal of Pt, Cu, Ag, and Au; an allow of Pt, Cu, Ag, and Au; a silica glass; an optical glass fiber; $Al_2O_3$; SiC; $Si_3N_4$; $ZrO_2$; and $Y_2O_3$;
a single crystal oxide superconductor layer coated over the substrate, the single crystal oxide superconductor layer being represented by the formula:

$$A_xB_yCu_zO_{9-\delta}$$

where: A includes at least one element selected from the group consisting of Sc, Y, La, Ce, Pr, Nd, Pm, Sm, Eu, Gd, Tb, Dy, Ho, Er, Tm, Yb, and Lu; B includes at least one element selected from the group consisting of Be, Sr, Mg, Ca, ba, and Ra; about $0.1 < x <$ about 2.0; about $1 < y <$ about 3; about $1 < z <$ about 3; and about $0 < \delta <$ about 7; and
a single crystalline intermediate layer, interposed between and adhered to the substrate and the single crystal oxide superconductor, the intermediate layer being made of a substance having an intermediate value in each of thermal expansion coefficient and lattice constant between values of the substrate and the superconductor layer, wherein the intermediate layer is made of a substance selected from the group consisting of $Cu_2O$, ZnO, $Al_2O_3$, BaO, $MgF_2$, $CaF_2$, and $BaF_2$.

7. A single crystalline oxide superconductor formed by a method comprising the steps of:
(a) coating one face of a substrate with an oxide superconductor for forming an oxide superconductor layer, wherein the substrate is made of a substance selected from the group consisting of: a polycrystalline metal of Pt, Cu, Ag, and Au; an alloy of Pt, Cu, Ag, and Au; a silica glass; an optical glass fiber; $Al_2O_3$; SiC; $Si_3N_4$; $ZrO_x$; and $Y_2O_3$, and the single crystal oxide superconductor is represented by the formula:

$$A_xB_yCu_zO_{9-\delta}$$

where: A includes at least one element selected from the group consisting of Sc, Y, La, Ce, Pr, Nd, Pm, Sm, Eu, Gd, Tb, Dy, Ho, Er, Tm, Yb, and Lu; B includes at least one element selected from the group consisting of Be, Sr, Mg, Ca, Ba, and Ra; about $0.1 < x <$ about 2.0; about $1 < y <$ about 3; about $1 < z <$ about 3; and about $0 < \delta <$ about 7; then
(b) heating the oxide superconductor layer so that the oxide superconductor has a single crystalline structure.

8. A single crystalline oxide superconductor recited in claim 7, formed by a method comprising the steps of:
coating the one face of the substrate, prior to forming the oxide superconductor layer, with a substance for forming an intermediate layer, wherein the intermediate layer is made of a substance selected from the group consisting of $Cu_2O$, ZnO, $Al_2O_3$, BaO, $MgF_2$, $CaF_2$, and $BaF_2$, then
heating the intermediate layer for single crystallizing the intermediate layer;
whereby the intermediate layer substantially matches both the superconductor layer and the substrate both in lattice constant and in thermal expansion coefficient.

9. The single crystal oxide superconductor of claim 1, further comprising:
a hermetic layer covering the oxide superconductor layer.

10. A single crystal oxide superconductor comprising a substrate made of a substance selected from a group consisting of: a single crystalline semiconductor of Si, GaAs and InP; $SiO_2$; $Al_2O_3$ and $LiNbO_3$; a single crystal oxide superconductor layer coated over the substrate, the single crystal oxide superconductor layer having a high critical temperature; and a single crystalline super lattice layer including compositions of both the substrate and the oxide superconductor, the single crystalline super lattice layer being positioned between the substrate and the oxide superconductor,
wherein the superconductor layer is represented by the formula:

$$A_xB_yCu_zO_{9-\delta}$$

where: A includes at least one element selected from the group consisting of Sc, Y, La Ce, Pr, Nd, Pm, Sm, Eu, Gd, Tb, Dy, Ho, Er, Tm, Yb, and Lu; B includes at least one element selected from the group consisting of Be, Sr, Mg, Ca, Ba, and Ra; where about $0.1°x <$ about 2.0, about $1 < y <$ about 3, about $1 < z <$ about 3, and $0 < \delta <$ about 7.

11. A single crystalline oxide superconductor formed by a method comprising the steps of:
(a) coating one face of the substrate with a substance for forming super lattice layers, the substrate being made of a substance selected from the group consisting of: a single crystalline semiconductor of Si, GaAs and InP; $SiO_2$; $Al_2O_3$ and $LiNbO_3$;
(b) heating the super lattice layers for single crystallizing the super lattice layer;
(c) coating the super lattice layers with an oxide superconductor layer represented by the formula;

$$A_xB_yCu_2O_{9-\delta}$$

where: A includes at least one element selected from the group consisting of Sc, Y, La, Ce, Pr, Nd, Pm, Sm, Eu, Gd, Tb, Dy, Ho, Er, Tm, Yb, and Lu; B includes at least one element selected from the group consisting of Be, Sr, Mg, Ca, Ba, and Ra; about $0.1 < x <$ about 2.0; about $1 < y <$ about 3; about $1 < z <$ about 3; and about $0 < \delta <$ about 7; whereby the intermediate layer substantially matches both the superconductor layer and the substrate both in lattice constant and in thermal expansion coefficient; and (d) heating the oxide superconductor layer so that the oxide superconductor has a single crystalline structure;

wherein step (a) further comprises forming a plurality of super lattice layers over the one face of the substrate in a stacked manner with an uppermost super lattice layer adhered to the superconducting layer and a lowermost super lattice adhered to the substrate, each super lattice layer including components of each of the superconductor layer and the substrate, and the proportion of the superconductor layer components in each super lattice layer being gradually increased from the lowermost super lattice layer towards the uppermost super lattice layer while the proportion of the components of the substrate in each super lattice layer is gradually decreased from the lowermost super lattice layer towards the uppermost super lattice layer.

* * * * *